United States Patent [19]

Kyung et al.

[11] Patent Number: 5,331,507
[45] Date of Patent: Jul. 19, 1994

[54] CLIP FOR MOUNTING A HEAT SINK ON AN ELECTRONIC DEVICE PACKAGE

[75] Inventors: Johnny S. Kyung; Pearce R. Jones, both of Austin, Tex.

[73] Assignee: Dell USA L.P., Austin, Tex.

[21] Appl. No.: 700,782

[22] Filed: May 15, 1991

[51] Int. Cl.$^5$ ............................................. H04K 7/20
[52] U.S. Cl. ...................................... 361/720; 24/458; 174/16.3; 248/510; 361/760
[58] Field of Search ............ 165/80.2, 80.3, 185; 357/79, 81; 174/16.3; 361/400, 403, 427, 386, 387, 388, 389, 417, 419, 420; 24/457, 458, 625; 248/316.7, 505, 510; 439/68, 71, 485

[56] References Cited

U.S. PATENT DOCUMENTS

| | | | |
|---|---|---|---|
| 4,575,038 | 3/1986 | Moore | 248/205 |
| 4,587,595 | 5/1986 | Staples | 174/16.3 |
| 4,716,494 | 12/1987 | Bright | 361/386 |
| 4,716,498 | 12/1987 | Ellis | 361/386 |
| 4,745,456 | 5/1988 | Clemens | 357/79 |
| 4,933,746 | 7/1990 | King | 357/81 |
| 5,019,940 | 5/1991 | Clemens | 361/386 |

OTHER PUBLICATIONS

IBM Tech Discl Bull vol. 23 No. 12 May 1981, pp. 217, Almquist, "Spring-Clip . . . Heat Sink".

*Primary Examiner*—Gerald P. Tolin
*Attorney, Agent, or Firm*—Thomas G. Devine; James W. Huffman

[57] ABSTRACT

A resilient heat sink clip has a pair of legs joined together at one end by an acruate member. The other ends of the legs each terminate in a hook. The arcuate member bears against a heat sink while pressing it into thermal contact with an electronic device package to conduct heat into the heat sink and then into the atmosphere.

4 Claims, 3 Drawing Sheets

CLIP FOR MOUNTING A HEAT SINK ON AN ELECTRONIC DEVICE PACKAGE

BACKGROUND OF THE INVENTION

1. Field of the Invention

This invention relates generally to removing heat from electronic device packages. More specifically, it relates to apparatus for use in securing a heat sink to an electronic device package for heat transfer.

2. Description of the Related Art

One type of electronic device package is the microprocessor. To remove heat from the microprocessor, a heat sink is placed in contact with the electronic device package for transferring heat through conduction from the semiconductor device contained in the electronic device package and rapidly dissipating such heat to the environment. Typically, heat sinks are made of metal and are finned to provide a larger surface for heat dissipation.

Various means have been used in the past to attach a heat sink in intimate thermal contact with an electronic device package. It is known to glue or otherwise adhesively attach a heat sink to an electronic device package such as a microprocessor. However, this is an expensive, inaccurate procedure.

Another prior art system in U.S. Pat. No. 4,745,456 describes the use of a heat sink clip assembly, including a frame having a pair of latching members on its perimeter to engage the clip. A disadvantage of this system is the fact that the frame must be soldered in place underneath the socket, making replacement of the socket itself or the frame rather difficult.

Another prior art system is one where the heat sink itself is provided with clips to clip to the semiconductor package. While this is a good idea, in practice, it is quite difficult to affix the heat sink to the electronic device package.

The present invention overcomes the shortcomings of the prior art by providing a system that makes attaching a heat sink to an electronic device package a simple task and an inexpensive one.

BRIEF SUMMARY OF THE INVENTION

The present invention provides a heat sink clip for securing a heat sink to an electronic device package whose leads are connected through a socket mounted on a printed circuit board, to the printed circuit board. The heat sink is mounted to the electronic device package and held in place by the heat sink clip which, in this preferred embodiment, is made of spring steel. The heat sink clip has a pair of legs spaced apart at their first ends by a contiguous connecting member, the member being pressed against the heat sink. At least a portion of the member is arcuately formed, with the apex of the arc bearing against the heat sink to aid in providing a firm force. The legs of the clip are formed at an angle exceeding a right angle with the member and further have hooks formed at their second ends to engage the underside of the printed circuit board, through an aperture therein. The angle of the legs, and the hooks, secure the clip firmly to the printed circuit board and provide a firm force by the member against the heat sink, thereby enabling the heat transfer from the electronic device package device to the heat sink.

The principal object of this invention is to provide apparatus for firmly holding a heat sink in contact with an electronic device to cause dissipation of heat from the electronic device to the heat sink.

Another object of this invention is to provide apparatus for securing a heat sink to an electronic device that is inexpensive and easy to use.

These and other objects will be evident in the detailed description that follows.

DETAILED DESCRIPTION OF THE INVENTION

Figure 1:
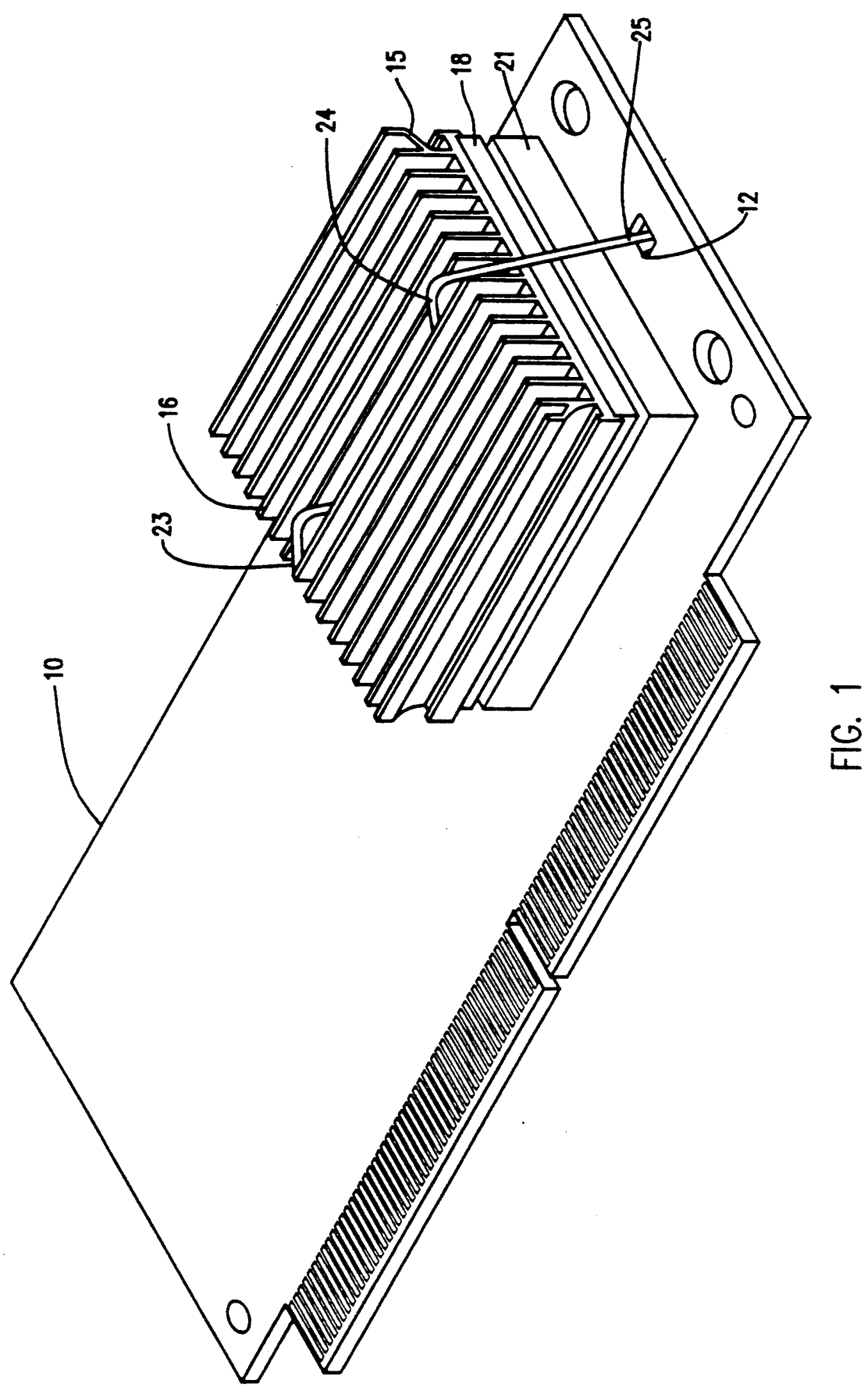
FIG. 1 is a perspective drawing of the heat sink clip of this invention holding a heat sink in place against an electronic device package.

Turning first to FIG. 1, printed circuit board 10 is shown with socket 21 in place. Electronic device package 18 is shown in place in socket 21 with heat sink 15 in position on top of electronic device package 18. Heat sink 15 is formed with a plurality of fins 16. Heat sink clip 20 (FIG. 2) is shown with member 24 in place between two of the fins 16, and leg 25 terminating through aperture 12 in printed circuit board 10.

Figure 2:
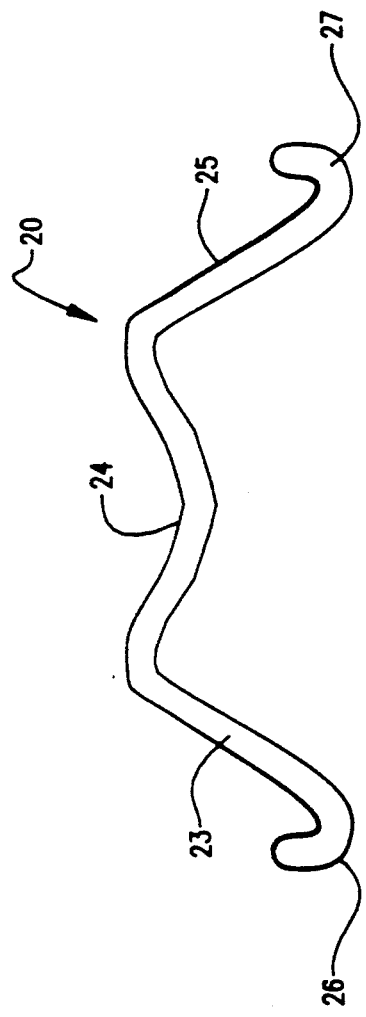
FIG. 2 is an elevation of the heat sink clip.

FIG. 2 shows heat sink clip 20 having member 24 formed in an arc in its central portion and having legs 23 and 25 formed at an angle greater than a right angle with respect to member 24. Each of legs 23 and 25 has a hook 26 and 27 formed at its end to engage the printed circuit board through apertures 11 and 12, respectively.

Figure 3:
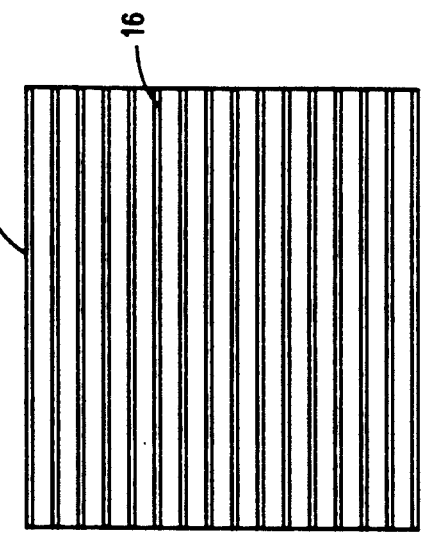
FIG. 3 is a top view of the heat sink.

FIG. 3 illustrates heat sink 15 having a plurality of fins 16.

Figure 4:
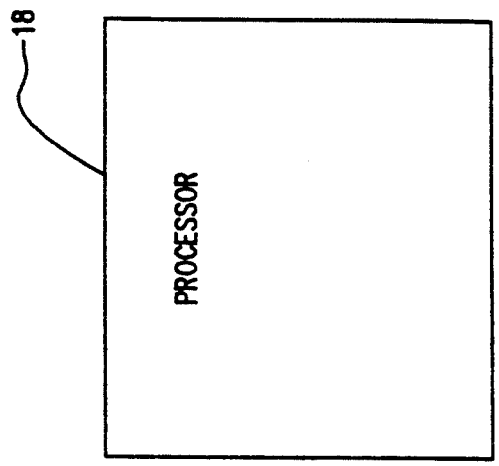
FIG. 4 is a top view of the electronic device package.

FIG. 4 is a plan view of the electronic device package 18 (a microprocessor in this preferred embodiment) to which heat sink 15 is applied and held in place by heat sink clip 20.

Figure 5:
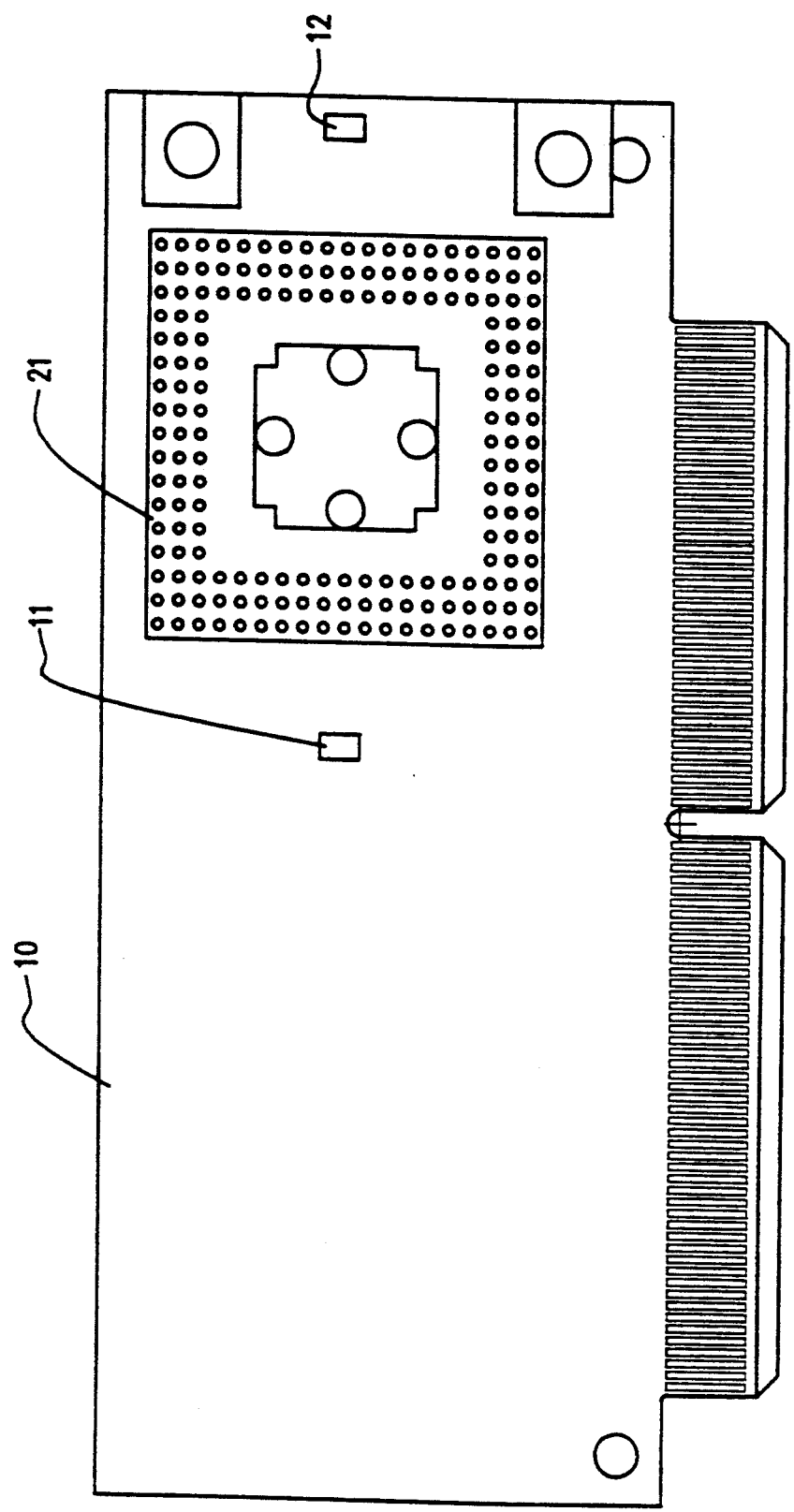
FIG. 5 is a top view of the printed circuit board with the socket in place.

FIG. 5 shows printed circuit board 10 having apertures 11 and 12 for securing hooks 26 and 27 of heat sink clip 20. Socket 21 is shown in position for receiving the leads from microprocessor 18.

MODE OF OPERATION OF THE INVENTION

Referring to the figures, electronic device package 18 is inserted into socket 21 and heat sink 15 is placed on top of electronic device package 18. Heat sink clip 20 is then placed on top of heat sink 15 and legs 23 and 25 are compressed inwardly to enable insertion into apertures 11 and 12. Hooks 26 and 27 then bear against the underside of printed circuit board 10 providing a force to the member 24 against heat sink 15, forcing it to seat firmly against electronic device package 18.

This invention has been disclosed above with regard to a preferred embodiment. This embodiment is not intended to limit the scope of this invention. For instance, although the heat sink clip assembly has been illustrated in use with a finned heat sink and a microprocessor, the invention is obviously applicable for use with other heat sink designs as well as other types of electronic device packages. It is to be understood, therefore, that various changes and modifications may be resorted to without departing from the spirit and scope of the invention which is limited only by the appended claims.

We claim:

1. Apparatus mounting a heat sink on an electronic device package having a plurality of leads connected through a socket mounted on a printed circuit board, to the printed circuit board comprising:
   (a) a clip having a pair of legs spaced apart at their first ends by a contiguous connecting member, the member being pressed against the heat sink; and
   (b) aperatures in the printed circuit board, receiving and securing the second ends of the legs to provide a firm force by the member against the heat sink.

2. The apparatus of claim 1 wherein at least a portion of the member is arcuately shaped, with the apex of the arc bearing against the heat sink, to aid in providing a firm force to the heat sink.

3. The apparatus of claim 2 wherein the second ends of each of the legs are shaped as hooks and anchor on the underside of the printed circuit board through the pair of apertures, respectively.

4. The apparatus of claim 3 wherein each of the pair of legs extends at an angle exceeding a right angle with respect to the connecting member to exert pressure against the sides of each of the pair of apertures.

* * * * *